952/101

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 13, 1970

870 O.G. 394

T870,012

STRIPPER SOLUTIONS

Kenneth R. Dunham, Rochester, and Richard A. Newcomb, Hilton, N.Y. (both % Kodak Park, Rochester, N.Y. 14650)

Filed Oct. 28, 1968, Ser. No. 771,361

Int. Cl. D06l *3/16*

U.S. Cl. 252—101

No Drawing. 13 Pages Specification

A low toxicity stripper solution for removing hardened photomechanical images, such as photoresists of hardened cyclized rubber compositions, comprises an oxidizing agent, at least one swelling solvent such as an aromatic hydrocarbon solvent or a mixture of aromatic hydrocarbon and chlorinated hydrocarbon solvents, a solvent for the oxidizing agent such as a cyclic alcohol, a cyclic ester and an aromatic sulfonic acid. In a preferred embodiment the oxidizing agent is nitric acid, the swelling solvent is xylene or tetrahydronaphthalene or a mixture thereof with chlorobenzene, the solvent for the oxidizing agent is cyclohexanol and the aromatic sulfonic acid is naphthalene sulfonic acid. This stripper solution exhibits sufficient activity at room temperature (20° C.) that it can be effectively used at such temperature; it contains relatively small amounts of toxic chemicals so that it can be handled without undue hazard to the user; and, because both of the relatively low temperatures at which it is employed and the relatively small amounts of toxic chemicals which it contains, it is not a substantial air pollutant.